(12) United States Patent
Butcher et al.

(10) Patent No.: US 11,829,798 B2
(45) Date of Patent: Nov. 28, 2023

(54) SYSTEM AND METHOD TO IMPROVE DATA COMPRESSION RATIOS FOR FIXED BLOCK SIZES IN A SMART DATA ACCELERATOR INTERFACE DEVICE

(71) Applicant: DELL PRODUCTS, LP, Round Rock, TX (US)

(72) Inventors: Andrew Butcher, Cedar Park, TX (US); Shyamkumar Iyer, Cedar Park, TX (US); Glen Sescila, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 167 days.

(21) Appl. No.: 17/076,140

(22) Filed: Oct. 21, 2020

(65) Prior Publication Data

US 2022/0121499 A1 Apr. 21, 2022

(51) Int. Cl.
*G06F 9/50* (2006.01)
*G06F 9/38* (2018.01)
*G06F 9/54* (2006.01)
*G06F 9/4401* (2018.01)
*G06F 9/30* (2018.01)

(52) U.S. Cl.
CPC .......... *G06F 9/5044* (2013.01); *G06F 9/3001* (2013.01); *G06F 9/3877* (2013.01); *G06F 9/4411* (2013.01); *G06F 9/544* (2013.01)

(58) Field of Classification Search
None
See application file for complete search history.

(56) References Cited

U.S. PATENT DOCUMENTS

| | | | |
|---|---|---|---|
| 9,652,408 B2 | 5/2017 | Cherian et al. | |
| 10,275,162 B2 | 4/2019 | Kan et al. | |
| 10,366,026 B1* | 7/2019 | Diamant | G06F 12/023 |
| 11,113,113 B2* | 9/2021 | Kumar | G06F 9/505 |
| 2016/0246811 A1* | 8/2016 | Ackerman | G06F 16/1744 |
| 2016/0294409 A1* | 10/2016 | Nam | H03M 7/6011 |
| 2016/0359760 A1* | 12/2016 | Vishnyakov | H04L 47/2483 |
| 2018/0152201 A1* | 5/2018 | Gopal | H01R 13/4538 |
| 2020/0133545 A1* | 4/2020 | Alkalay | G06F 12/0238 |
| 2021/0306373 A1* | 9/2021 | Guo | H04L 69/329 |

* cited by examiner

*Primary Examiner* — Umut Onat
(74) *Attorney, Agent, or Firm* — Larson Newman, LLP

(57) ABSTRACT

An information handling system for compressing data includes multiple compression engines, a source data buffer to provide compression data to the compression engines, at least one destination data buffer to receive compressed data from the compression engines, and a compression engine driver. Each compression engine is configured to provide a different compression function. The compression engine driver directs each compression engine to compress data from the source data buffer, and retrieves select compressed data from a first one of the compression engines from the at least one destination data buffer. The selection is based upon a selection criterion.

19 Claims, 7 Drawing Sheets

SYSTEM AND METHOD TO IMPROVE DATA COMPRESSION RATIOS FOR FIXED BLOCK SIZES IN A SMART DATA ACCELERATOR INTERFACE DEVICE

CROSS REFERENCE TO RELATED APPLICATIONS

Related subject matter is contained in U.S. patent application Ser. No. 17/071,188 (DC-121512) entitled "System and Method to Utilize a Composite Block of Data During Compression of Data Blocks of Fixed Size," filed Oct. 15, 2020, the disclosure of which is hereby incorporated by reference.

FIELD OF THE DISCLOSURE

This disclosure generally relates to information handling systems, and more particularly relates to improving data compression ratios of fixed block sizes in a Smart Data Accelerator Interface (SDXI) device.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system for compressing data may include multiple compression engines, a source data buffer to provide compression data to the compression engines, at least one destination data buffer to receive compressed data from the compression engines, and a compression engine driver. Each compression engine may be configured to provide a different compression function. The compression engine driver may direct each compression engine to compress data from the source data buffer, and may retrieve select compressed data from a first one of the compression engines from the at least one destination data buffer. The selection may be based upon a selection criterion.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
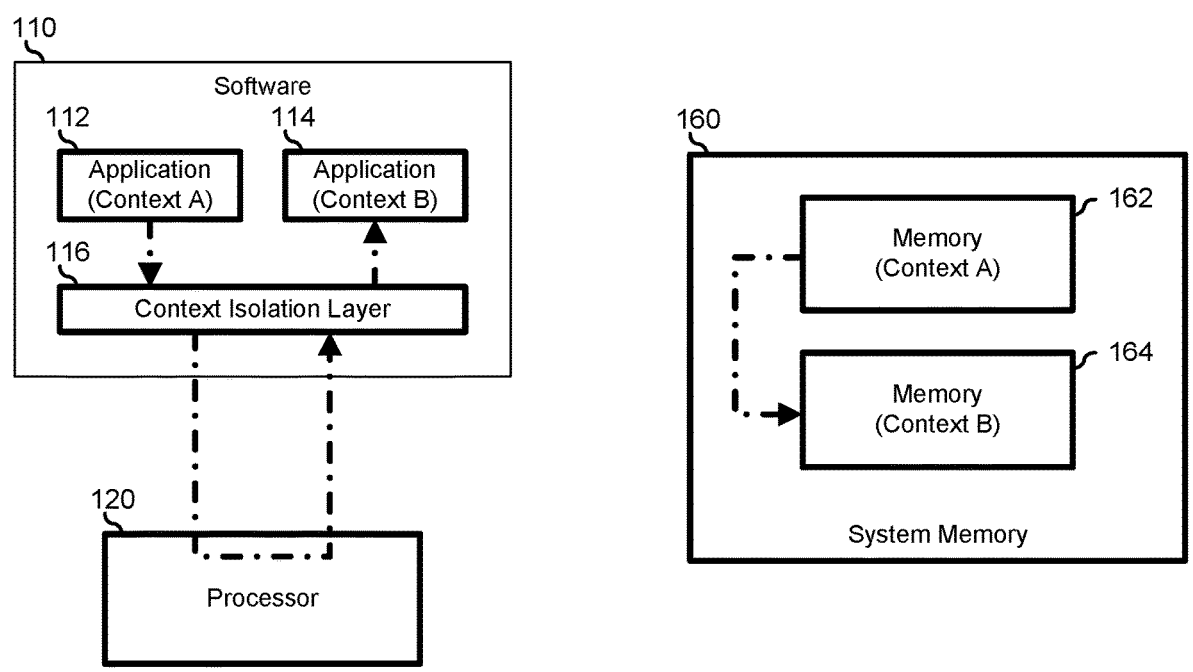
FIG. 1 is a block diagram of an information handling system according to the prior art.

FIG. 1 illustrates an information handling system 100 that utilizes a data exchange architecture in accordance with the prior art. Information handling system 100 includes software 110, a processor 120, and a system memory 160. Software 110 represents machine-executable code stored on information handling system 100 that is executable by processor 120, and includes a first application 112 that is associated with a first context, a second application 114 that is associated with a second context, and a context isolation layer 116. Application 112 is associated with one or more address ranges in the system physical address space (SPA) provided by system memory 160. The address ranges associated with application 112 are collectively shown as a portion 162 of system memory 160. Similarly, application 114 is associated with one or more address ranges in system memory 160, collectively shown as a portion 164 of the system memory. Context isolation layer 116 represents one or more agent, application program interface (API), utility, or the like that operates to maintain the isolation between memory 162 and 164. Examples of context isolation layer 116 may include a system Basic Input/Output System (BIOS) or Universal Extensible Firmware Interface (UEFI), hereinafter referred to collectively as "BIOS," that operates to provide isolated memory ranges for system operations, a virtual desktop system that isolates various memory ranges for the use of multiple users of the virtual desktop system, a hypervisor or virtual machine manager (VMM) that sets up and maintains virtual machines and their associated memory ranges, or the like.

In operation, when applications 112 and 114 are instantiated on information handling system 100, context isolation layer 116 allocates memory 162 and 164 to the use of their respective applications. In addition, when applications 112 and 114 need to interact, for example by moving data from one application to the other, context isolation layer 116 operates to manage the transfer of data between memory 162 and 164.

Note here that the data exchange architecture of information handling system 100 requires the execution of code associated with context isolation layer 116 by processor 120 in order to perform data transfers between memory 162 and memory 164. As such, the prior art data exchange architecture imposes a processing burden on processor 120, thereby reducing the processor cycles available for performing other tasks associated with applications 112 and 114. It will be understood that this processing overhead may be partially mitigated by the inclusion of Direct Memory Access (DMA) hardware in information handling system 100. However, it will be further understood that such DMA hardware is typically a vendor specific add-on, and access to such DMA hardware by applications 112 and 114 directly is typically difficult. In particular, even with the inclusion of DMA hardware, processor 120 is still needed to set up DMA transfers, and context isolation layer 116 is still needed in its role as gatekeeper to system memory 160.

Figure 2:
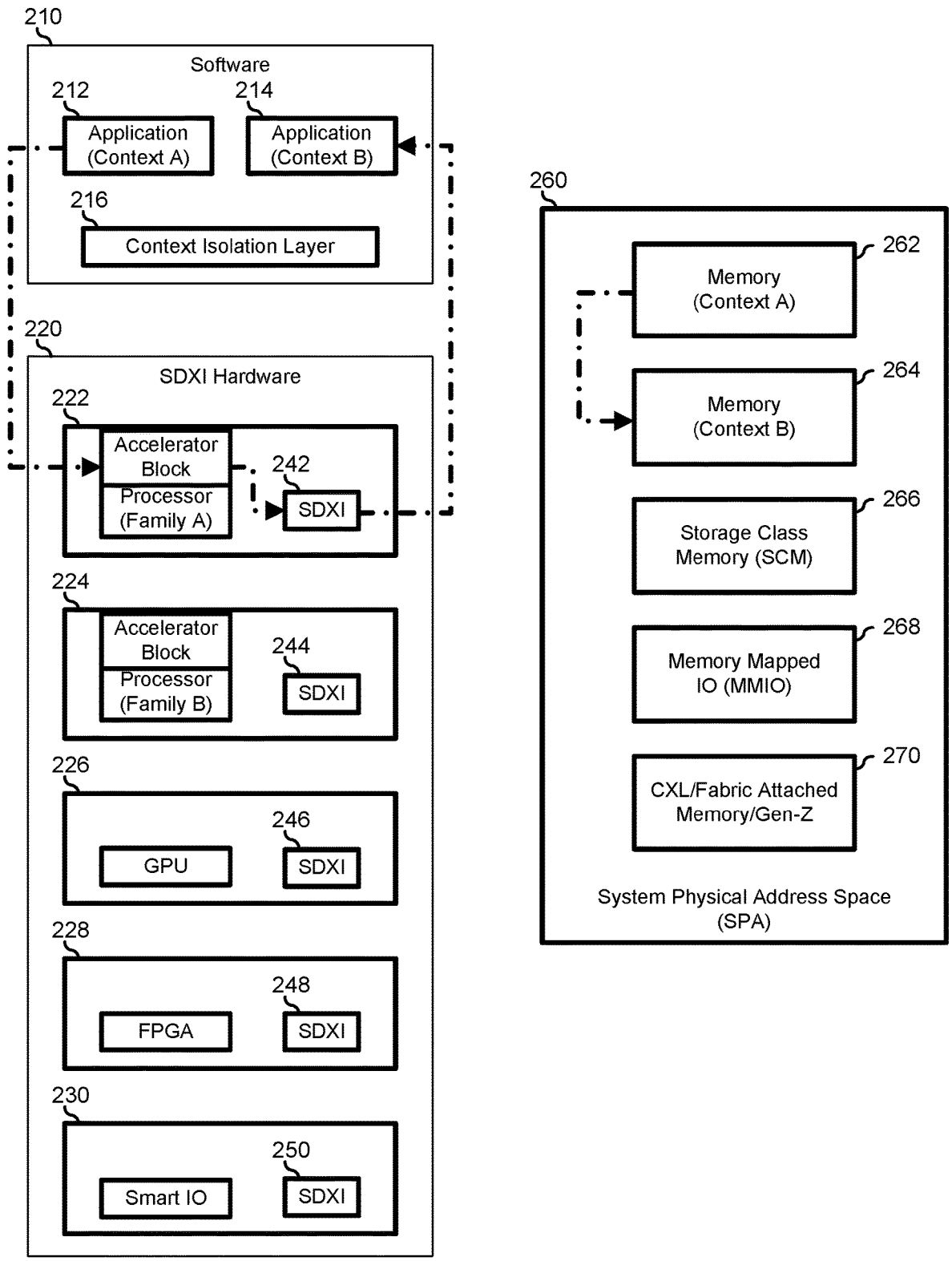
FIG. 2 is a block diagram of an information handling system according to an embodiment of the current disclosure.

FIG. 2 illustrates an information handling system 200 that utilizes a Smart Data Accelerator Interface (SDXI) data exchange architecture in accordance with an embodiment of the current disclosure. Information handling system 200 includes software 210, SDXI hardware 220, and a system physical address space (SPA) 260. SDXI hardware 220 includes a first family of processors 222 and an associated SDXI interface 242, a second family of processors 224 and an associated SDXI interface 244, one or more Graphics Processor Unit (GPU) 226 and an associated SDXI interface 246, a Field-Programmable Gate Array (FPGA) 228 and an associated SDXI interface 248, and a Smart I/O device 230 and an associated SDXI interface 250. Software 210 is similar to software 110, and represents machine-executable code stored on information handling system 200 that is executable by a processor such as one or more of processors 222 and 224. Software 210 includes a first application 212 that is associated with a first context, a second application 214 that is associated with a second context, and a context isolation layer 216. Software 210 may include functions and features similar to software 110, as described above. In particular, software 210 may implement the data exchange architecture of information handling system 100, as needed or desired. As such, application 212 is associated with one or more address ranges in SPA 260, with the associated address ranges shown as a portion 262 of the SPA, and application 214 is associated with one or more address ranges in the SPA, with the associated address ranges shown as a portion 264 in the SPA. Here too, context isolation layer 216 is similar to context isolation layer 116, representing one or more agent, API, utility, or the like that operates to maintain the isolation between memory 262 and memory 264. As such, context isolation layer 216 operates to allocate memory 262 and memory 264 when respective application 212 and application 214 are instantiated on information handling system 200, and the context isolation layer prevents the use of various memory ranges by unauthorized applications.

The SDXI data exchange architecture represents an industry effort to expand and standardize data movement protocols and hardware accelerator interfaces. As such, information handling system 200 broadens the scope of data exchanges on both the hardware side and the memory side. In particular, on the hardware side, SDXI hardware 220 incorporates various types of processing elements, co-processors, accelerators, and other data movers, as typified by processor families 222 and 224, GPU 226, FPGA 228, and Smart I/O device 230. On the memory side, SPA 260 is expanded to include not only the system physical memory, as typified by memory 262 and memory 264, but also separately attached memory, such as Storage Class Memory (SCM) devices 266, memory mapped I/O (MMIO) devices 268, and memory architectures, such as Compute Express Link (CXL) and Gen-Z memory interfaces, fabric-attached memory, and the like, as shown collectively as memory device 270. In particular, the SDXI data exchange architecture treats all of memory devices 262, 264, 266, 268, and 270 as a single SPA 260. The SDXI data exchange architecture then provides standardized interfaces for data movement between software 210, SDXI hardware 220, and SPA 260. Here, SDXI interfaces 242, 244, 246, 248, and 250 represent hardware and software associated with their respective hardware devices, such that a common set of SDXI commands, instructions, procedures, calls, and the like, referred to hereinafter as "SDXI commands," can be made to the hardware devices. Here, the details of implementing the various SDXI commands can be left to the design requirements and desires of the various hardware manufacturers. In this way, the SDXI data exchange architecture remains extensible and forward-compatible with new hardware or memory developments, and is independent of actual data movement details, data acceleration implementations, and the underlying I/O interconnect technology. The SDXI commands support: data movement between different address spaces including user address spaces located within different virtual machines; data movement without mediation by privileged software once a connection has been established; an interface and architecture that can be abstracted or virtualized by privileged software to allow greater compatibility of workloads or virtual machines across different servers; a well-defined capability to quiesce, suspend, and resume the architectural state of a per-address-space data mover to allow "live" workload or virtual machine migration between servers; mechanisms to enable forwards and backwards compatibility across future specification revisions, allowing software and hardware designed to different specification revisions to interoperate; the ability to incorporate additional offloads in the future leveraging the architectural interface; and a concurrent DMA model. As used herein, SDXI will be understood to represent any present or future specifications, specification revisions, articles, working papers, or other publications of the Smart Data Accelerator Interface (SDXI) Technical Working Group (TWG) of the Storage Networking Industry Association (SNIA).

Figure 3:
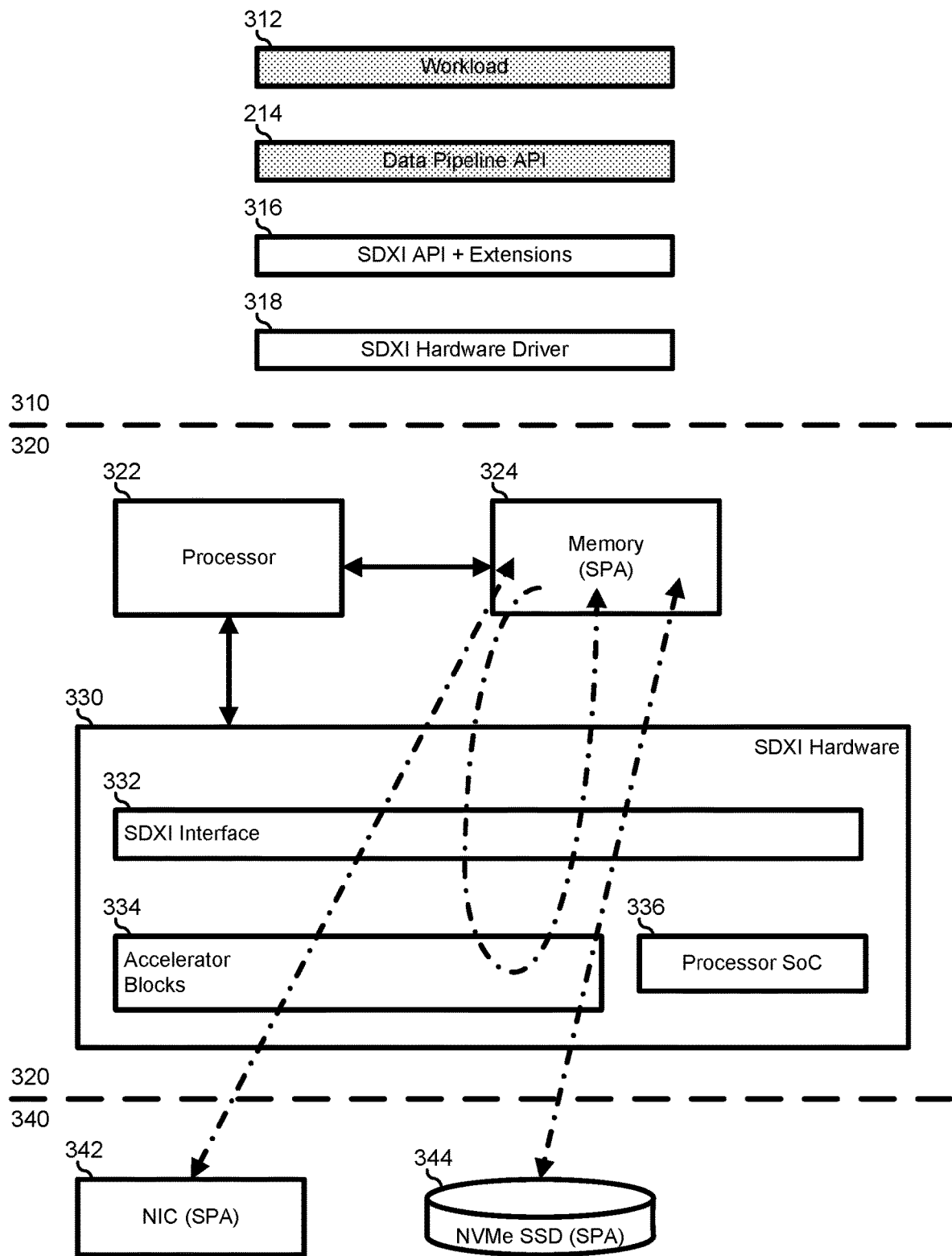
FIG. 3 is a block diagram of an information handling system according to another embodiment of the current disclosure.

FIG. 3 illustrates an embodiment of an information handling system 300 similar to information handling system 200. Information handling system 300 includes a software layer 310, a hardware layer 320, and an attachment layer 340. Software layer 310 is similar to software 210, and includes a workload 312, a data pipeline API 314, a SDXI API 316, and a SDXI hardware driver 318. Hardware layer 320 includes a processor 322, a memory (SPA) 324, and a SDXI hardware device 330. Attachment layer 340 includes a Network Interface Card (NIC) 342 and a Non-Volatile Memory-Express (NVMe) Solid State Drive (SSD) 344. NIC 342 and SSD 344 are each extensions of the SPA space of information handling system 300.

Workload 312 and data pipeline API 314 operate similarly to applications 212 and 214, and context isolation layer 216, and represent elements of a typical information handling system that perform the processing task of the information handling system. In particular, workload 312 operates to perform various operations on data and to move data between different storage and processing elements of information handling system 300, and may make various service calls to data pipeline API to assist in such processing operations and data moves. SDXI API 316 represents an API configured to provide the core operability as specified by a particular revision of an SDXI specification. In addition, SDXI API 316 provides additional extensions to the core operability of the particular SDXI specification, as described below. When workload 312 or data pipeline API 314 invoke SDXI API 316 for the various data operations or data moves, the SDXI API operates to direct SDXI hardware driver 318 elicit SDXI hardware 330 to perform one or more of the invoked operations or data moves, as needed or desired. In this regard, SDXI hardware driver 318 and SDXI hardware 330 are closely associated with each other.

As such, SDXI hardware 330 represents a wide variety of different types of hardware that can be utilized to perform the SDXI core operations and extensions as described herein. An example of SDXI hardware 330 may include accelerator blocks within a general purpose processor or processor family, such as a CPU or the like, a purpose specific processor, such as a GPU or the like, a logic-based device or state-based device, such as a FPGA, a Complex Programmable Logic Device (CPLD) or the like, a smart I/O device that provides in-line data processing in the course of I/O operations, such as a smart NIC, a Host Bus Adapter (HBA), a storage controller such as a RAID controller, a Network Attached Storage (NAS) device, a Storage Area Network (SAN) controller, or the like, or another processing device, as needed or desired. Here, it will be understood that, SDXI hardware 330 may be configured to provide operations consistent with its type, but that are not specifically associated with its SDXI functionality. For example, where SDXI hardware 330 represents a FPGA type of device, it will be understood that the FPGA device may be invoked to provide functionality of a more general nature, in addition to the SDXI functionality as described herein.

SDXI hardware 330 includes a SDXI interface 332, various accelerator blocks 334, and a processor SoC 336. Accelerator blocks 334 may represent hardware accelerators, logic-based or state-based accelerators, or other configurable or pre-configured accelerator functions, as needed or desired. As described further below, SDXI hardware 330 may operate in some embodiments to provide enhanced data pipelining operations. For example, SDXI hardware 330 may provide data movement: between different locations in memory 324, to and from the memory and a network connected to NIC 342, to and from the memory and NVMe SSD 344, to and from the network and the NVMe SSD, and between different locations in the NVME SSD. SDXI hardware 330 may further operate in some embodiments to provide enhanced data transformation operations on data, either as atomic operations or in conjunction with the data movement utilizing various accelerator blocks 334. In particular, various embodiments of SDXI hardware 330 may provide: data compression/decompression, data encryption/decryption, data checksums, hash functions such as SHA-256 hashes and the like, RAID functions, erasure coding, and the like. Other functions that may be performed by SDXI hardware 330 may include data deduplication, LZ-4 compression, compression ratio and block size optimization, data operation chaining, multi-point data movement, uncompressible block handling, and query analytics.

Figure 4:
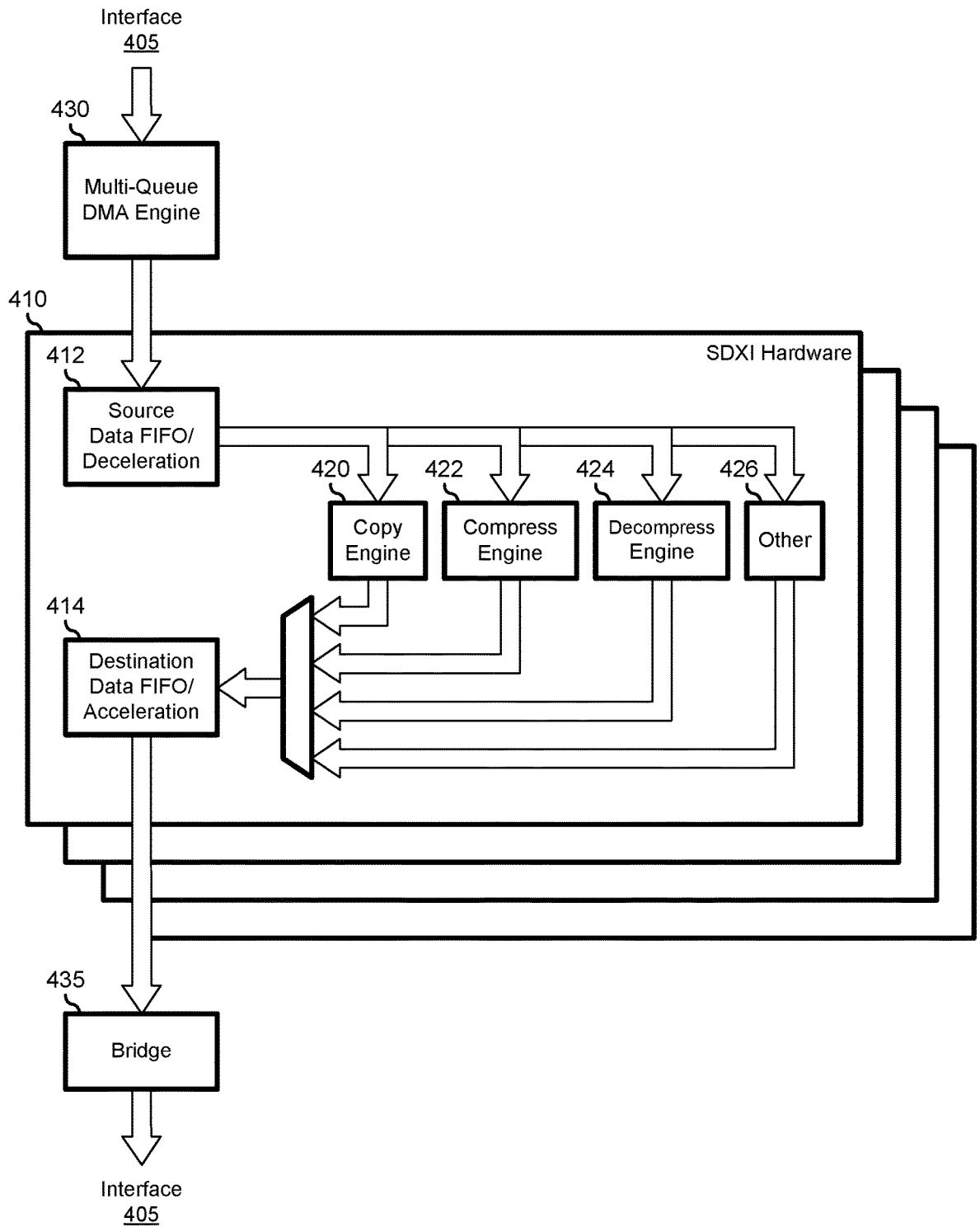
FIG. 4 is a block diagram of an information handling system according to another embodiment of the current disclosure.

FIG. 4 illustrates an embodiment of an information handling system 400 similar to information handling systems 200 and 300. Information handling system 400 includes a processor complex (not illustrated) that provides a communication interface 405 to provide data communications with multiple SDXI hardware devices 410. An example of interface 405 may include a Third Generation Peripheral Component Interconnect-Express (PCIe Gen3)×16 (16-lane) communication link, a PCIe Gen3 communication link with greater or fewer lanes (e.g., ×4, ×8, ×32), or another communication interface, as needed or desired. Information handling system 400 further includes a multi-queue Direct Memory Access (DMA) engine 430, and a data bridge 435. Each of the SDXI hardware devices 410 are connected to receive data and instructions from DMA engine 430, and to provide data and control information to data bridge 435. DMA engine 430 provides dynamic allocation of parallel data flows to the multiple SDXI hardware devices 410, as needed by the processing tasks operating on information handling system 400. The data flows are provided to DMA engine 430 via interface 405, and may be received from memory or storage devices within the SPA of information handling system 400. Data bridge 435 receives the data flows from SDXI hardware devices 410 and communicates the data flows via interface 405 to the memory and storage devices within the SPA of information handling system 400.

Each of the SDXI hardware devices 410 may be understood to be similar hardware devices, such as where the SDXI hardware devices are each provided by a common manufacturer and are a common device type. Here, DMA engine 430 may allocate data flows to the various SDXI hardware devices 410 based upon factors unrelated to the particular device type of the SDXI hardware devices. For example, DMA engine 430 may allocate data flows based upon the resource loading or availability of each of the SDXI hardware devices, the power level or power state of each of the SDXI hardware devices, or other factors not directly related to the type of the SDXI hardware devices, as needed or desired. Further, each of SDXI hardware devices 410 may be understood to be different hardware devices, such as where the SDXI hardware devices are provided by different manufacturers and are different device types. Here, DMA engine 430 may allocate data flows to the various SDXI hardware devices 410 based upon the type of each of the SDXI hardware devices. For example, where a particular SDXI hardware device 410 contains a network function, DMA engine 430 may allocate network based data flows to that particular SDXI function. On the other hand, where a different SDXI hardware device contains a storage controller function, DMA engine 430 may allocate storage based data flows to the other SDXI function.

SDXI hardware device 410 is illustrated as including a source data FIFO/deceleration module 412, a destination data FIFO/acceleration module 414, a copy engine 420, a compression engine 422, a decompression engine 424, and one or more additional engines 426. The configuration illustrated by SDXI hardware device 410 will be understood to be typical, and representative of a wide range of device configurations, as needed or desired. As such, the particular configuration illustrated by SDXI hardware device 410 should not be understood to be limiting on the type, nature, features, configuration, or functionality of SDXI hardware devices in general. Other functions that may be performed by SDXI hardware 410 may include data deduplication, LZ-4 compression, compression ratio and block size optimization, data operation chaining, multi-point data movement, uncompressible block handling, and query analytics.

The inventors of the current invention have understood that key measures for evaluating compression algorithms may include determining the compression ratio that different compression algorithms achieve, and determining the time to compress data with the different compression algorithms. It has been further noted that data compression in storage products, perform compression on standardized data block sizes, such as on 4 kilobyte (KB) boundaries. However, such small data block sizes permit little data history with which to search for matches with the compression algorithms, which can result in low compression ratios. 1 Hence comparisons of compression ratios for the different compression algorithms becomes even more important for optimizing storage performance. In other applications, such as streaming data services, optimizing compression ratios may be less important than determining the compression speed of different compression algorithms.

Figure 5:
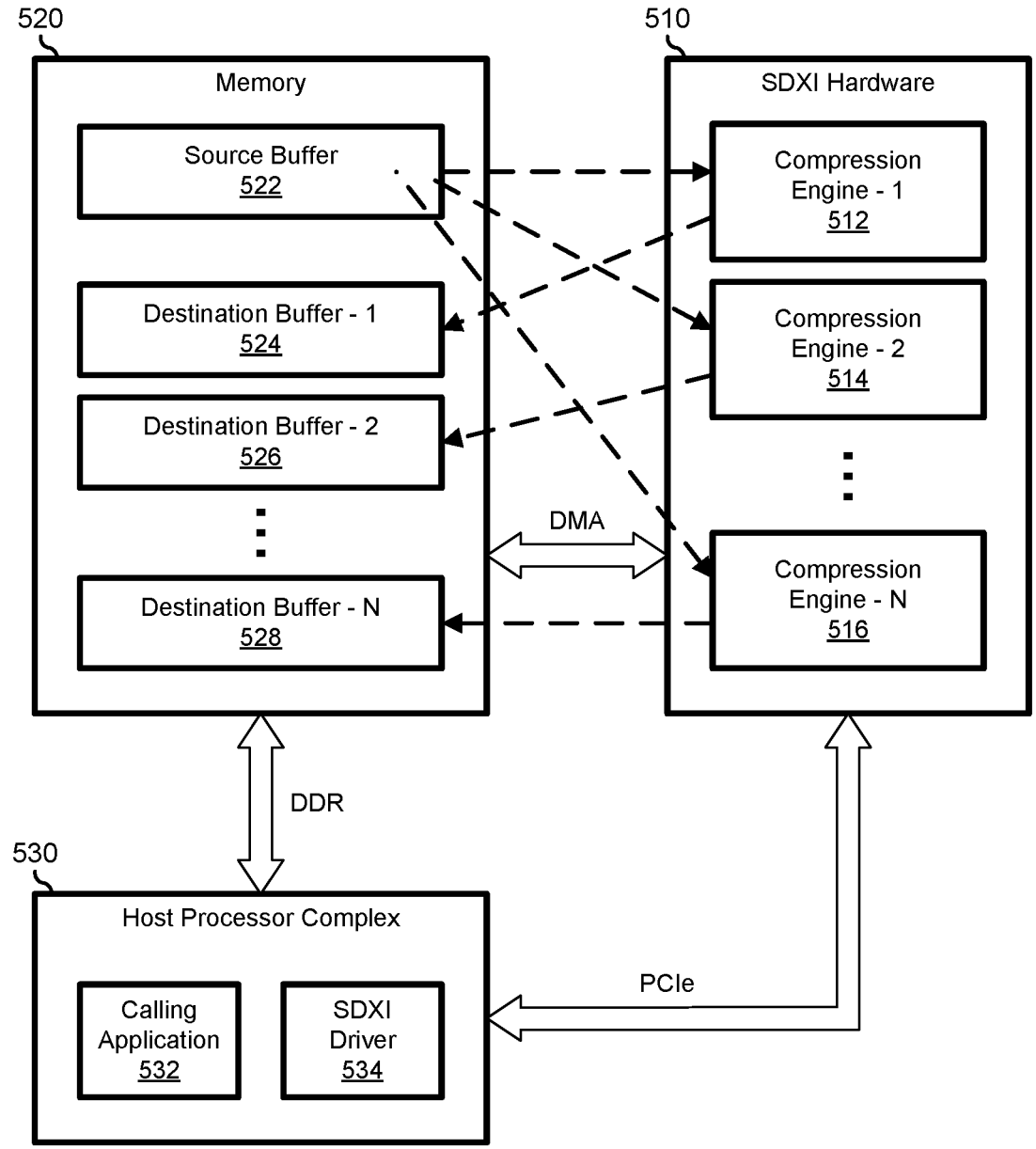
FIG. 5 is a block diagram of an information handling system according to another embodiment of the current disclosure.

FIG. 5 illustrates an embodiment of an information handling system 500 similar to information handling systems 200, 300, and 400. Information handling system 500 includes SDXI hardware 510, a memory storage device 520, and a host processor complex 530. SDXI hardware 510 is similar to SDXI hardware 220, 330, and 410. In particular, SDXI hardware 510 includes (N) compression engines, shown as compression engines 512, 514, and 516. Memory storage device 520 includes a compression source buffer 522, and compression destination buffers 524, 526, and 528. Memory storage device 520 represent a memory device within the SPA space of information handling system 500, and may include system physical memory, separately attached memory (SCM) devices, MMIO devices, and the like. Host processor complex 530 includes a compression calling application 532 and a SDXI driver 534. Host processor complex 530 represents a processor and associated hardware, firmware, operating system, application programs, and the like.

Calling application 532 represents an application program, utility, service, application program interface (API), or the like that provides service calls to compress data for storage, archiving, transmission, streaming, or other functions where data compression provides for the advantageous utilization of the compressed data. When calling application 532 intends to provide for data compression of various data, the calling application can, through SDXI driver 534, offload the compression request to SDXI hardware 510, as needed or desired. In particular, calling application 532, in conjunction with SDXI driver 534, operates to 1) request that the data to be compressed is loaded into source buffer 522, retrieved from other data storage of information handling system 500, pointed to, or otherwise made available for compression by SDXI hardware 510, 2) establish destination buffers 524, 526, and 528 to receive the compressed data from the SDXI hardware, and to invoke the SDXI hardware to perform the data compression.

Each of compression engines 512, 514, and 516 operate to receive data from source buffer 522, to compress the data in accordance with a particular compression algorithm, and to store the compressed data to an associated destination buffer of the memory storage device. In particular, compression engine 512 stores its compressed data to destination buffer 524, compression engine 514 stores its compressed data to destination buffer 526, and compression engine 516 stores its compressed data to destination buffer 528. The compression algorithms may include lossless compression algorithms, such as the LZ77 family (LZ4, DEFLATE, etc.) of compression algorithms, audio compression algorithms, graphics compression algorithms, or the like. In a particular embodiment, in receiving the source data from source buffer 522, each of compression engines 512, 514, and 516 may receive the source data directly from the source buffer via separate DMA transactions, for example where one or more of the compression engines reside on different physical hardware devices, that is, where SDXI hardware 520 represents multiple hardware devices. In another embodiment, in receiving the source data from source buffer 522, compression engines 512, 514, and 516 receive the source buffer indirectly from the source buffer. For example, where compression engines 512, 514, and 516 reside on a common physical hardware device, that is, where SDXI hardware 510 represents a single hardware device, the SDXI hardware may receive the source data from source buffer 522 via a single DMA transaction and may provide the source data to each of compression engines 512, 514, and 516. In this example, SDXI hardware 510 may be understood to include a memory device, such as a buffer for receiving the source data, and may include another buffer for storing the compressed data from compression engines 512, 514, and 516, before storing the compressed data to respective destination buffers 524, 526, and 528.

A particular compression algorithm may include various settings that may be manipulated in order to fine tune the compression performance of the compression algorithm, in terms of compression ratio, compression speed, or other metrics, as needed or desired. For example, considering the LZ4 algorithm, various parameters may be user selectable, such as selecting a compression level, selecting a minimum match length of 4, 6, or 8-bytes, selecting a hash table size, selecting from various static libraries, or the like. The selection of particular settings may yield different compression ratios or compression speeds, depending on the particular data that is being compressed. That is, first settings for a particular compression algorithm may yield a greater compression ratio with a first set of data than with a second set of data, and likewise second setting for the particular compression algorithm may yield a greater compression ratio with the second set of data than with the first set of data. This may also be true for compression speeds.

In a particular embodiment, compression engines 512, 514, and 516 are instantiations of different compression algorithms, of different settings for a common compression algorithm, or a combination of different compression algorithms and different settings for common compression algorithms. Here, calling application 532 and SDXI driver 534 operate to set up the compression algorithms for compression engines 512, 514, and 516. For example, where SDXI hardware 510 represents one or more FPGA type device, the compression algorithms can be programmed into the FPGA devices as needed or desired. Further, each compression engine can be programmed with the associated setting, or can receive the associated settings as an input. Here further, calling application 532 and SDXI driver 534 may select a range of settings for each one of compression engines 512, 514, and 516. Then, when a particular set data to be compressed, as directed by calling application 532, SDXI driver 534 directs SDXI hardware 510 to compress the data with all of compression engines 512, 514, and 516. In response, each one of compression algorithms 512, 514, and 516 operate to retrieve the data from source buffer 522, to compress the data, and to store the compressed data to the associated destination buffer 524, 526, and 528.

After each of compression engines 512, 514, and 516 have stored their associated compressed data to their associated destination buffers 524, 526, and 528, SDXI driver 534 operates to determine a compression ratio achieved by each of the compression engines. Here, if a greater compression ratio is desired, then SDXI driver 534 determines the compression ratio for the data in each of destination buffers 524, 526, and 528, selects the data with the highest compression ratio, returns the selected data to the calling application 532, and discards the rest of the compressed data from the non-selected destination buffers. For example, if calling application 532 is a storage application, then SDXI driver 534 only sends the most compressed version of the data to the associated storage array. Here further, if a higher speed compression is desired, then SDXI driver 534 determines which destination buffer 524, 526, or 528 is filled first, selects the fastest data buffer, returns the selected data to the calling application 532, and discards the rest of the compressed data from the non-selected destination buffers.

In a particular embodiment, each time calling application 532 requests to have data compressed, SDXI driver 534 performs the parallel compression as described above. That is, in each instance of data compression, compression engines 512, 514, and 516 operate in parallel, and, in effect, compete against each other to provide the most compressed or fastest compressed data. This embodiment may be particularly advantageous when the type of data to be requested varies from one request to another, such as where calling application 532 represents a program to provide zip files for various types of data. In another embodiment, after calling application 532 first requests to have data compressed and SDXI driver 534 determines a best one (i.e., highest compression ratio or fastest compression) of compression engine 512, 514, and 516, the SDXI driver continues to utilize the "best" compression engine on subsequent compression requests from calling application 532. This may be particularly advantageous when the type of data from calling application 532 is associated with a particular type of data, such as media content, database content, or the like. In another embodiment, SDXI driver 534 operates to determine the type of data that is to be compressed, and determines whether to direct each of compression engines 512, 514, and 516 to perform the compression to determine a best compression engine, or to direct a particular "known best" compression engine to perform the data compression, based upon, for example, the type of data to be compressed. In a particular embodiment, where a specific compression ratio is desired, SDXI driver 534 operates to implement a compression ratio threshold, wherein, when the compression threshold is achieved by one or more of compression engines 512, 514, and 516, the data is deemed to be compressible, and the best compressed data is selected. On the other hand, where none of compression engines 512, 514, or 516 achieve a compression ratio greater than the compression ratio threshold, SDXI driver 534 deems the data to be incompressible, and the uncompressed data from source buffer 522 is forwarded to the calling application 532, and none of destination buffers 524, 526, or 528 are selected for forwarding. In a particular example, where one or more of calling application 532 and SDXI driver 534 are associated with a distributed storage array, the SDXI driver can implement a predetermined compression ratio threshold. In yet another embodiment, SDXI driver 534 operates to implement a selection of a fastest compression engine that yields compressed data with a compression ration greater than a compression ratio threshold. For example, SDXI driver 532 can select the first compressed data that is compressed at greater than a predetermined compression ratio. It will be understood that, when any one of compression engines 512, 514, and 516 compress data based upon different settings, that the compression engines may provide metadata associated with the compressed data that identifies the settings utilized in the compression algorithm, so that, when the data is to be decompressed, a decompression engine may implement common settings or algorithm selection to uncompress the data, as needed or desired.

Figure 6:
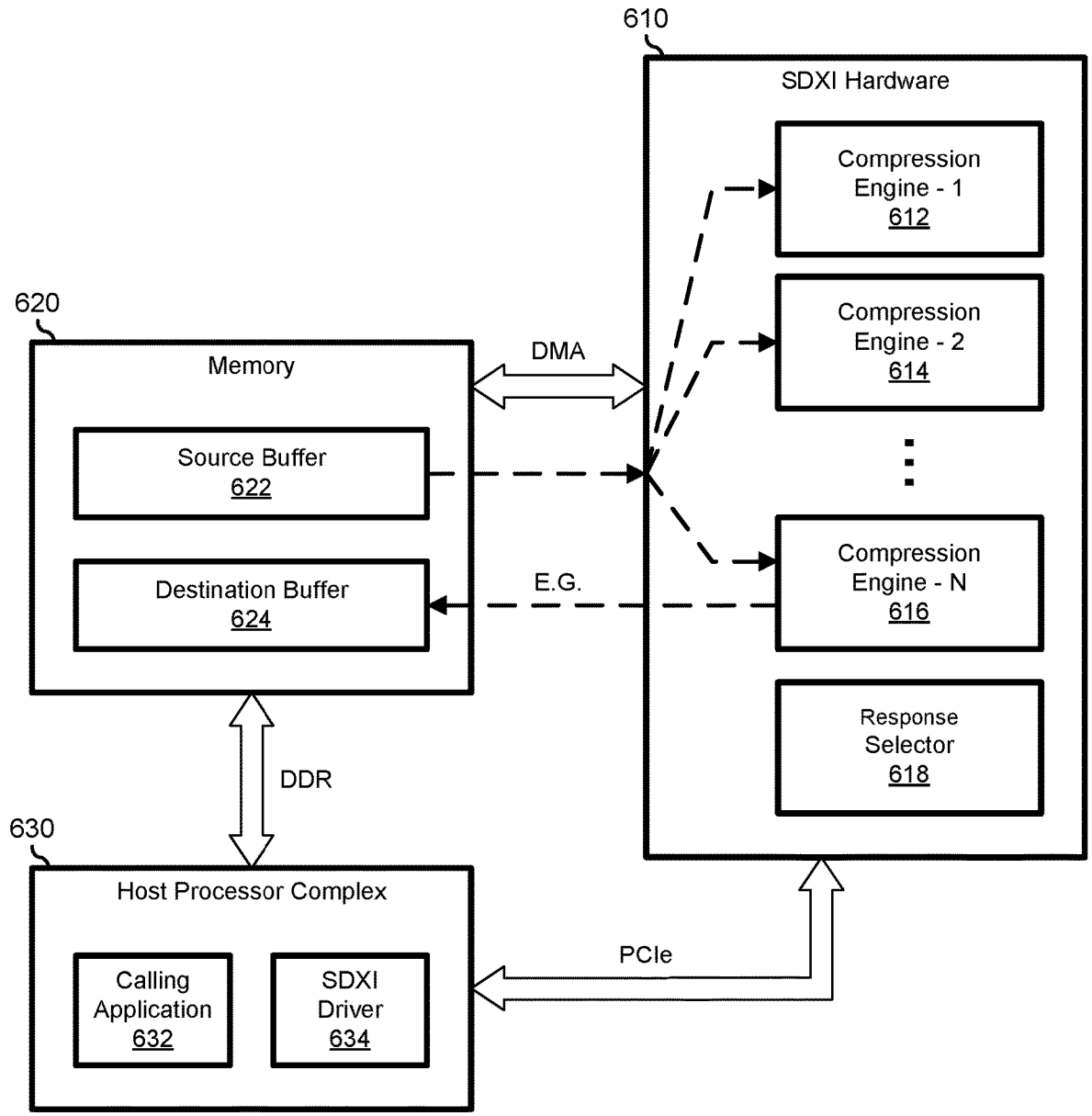
FIG. 6 is a block diagram of an information handling system according to another embodiment of the current disclosure.

FIG. 6 illustrates an embodiment of an information handling system 600 similar to information handling system 500. Information handling system 600 includes SDXI hardware 610, a memory storage device 620, and a host processor complex 630. SDXI hardware 610 is similar to SDXI hardware 510. In particular, SDXI hardware 610 includes (N) compression engines, shown as compression engines 612, 614, and 616. SDXI hardware 610 further includes a response selector logic 618, as described further below. Memory storage device 620 is similar to memory storage device 520, and includes a compression source buffer 622, and a compression destination buffer 624. Compression source buffer 622 is similar to compression source buffer 522, and compression destination buffer 624 is similar to compression destination buffers 524, 526, and 528, except that compression destination buffer 624 is a unified destination buffer, being configured to receive compressed data from any one of a number of compression engines. Host processor complex 630 is similar to host processor complex 530, and includes a compression calling application 632 and a SDXI driver 634. Calling application 632 is similar to calling application 532, and SDXI driver 634 is similar to SDXI driver 534.

When calling application 632 intends to provide for data compression of various data, the calling application can, through SDXI driver 634, offload the compression request to SDXI hardware 610, as needed or desired. In particular, calling application 632, in conjunction with SDXI driver 634, operates to 1) request that the data to be compressed is loaded into source buffer 622, retrieved from other data storage of information handling system 600, pointed to, or otherwise made available for compression by SDXI hardware 610, 2) establish destination buffer 624 to receive the compressed data from the SDXI hardware, and to invoke the SDXI hardware to perform the data compression.

Compression engines 612, 614, and 616 are similar to compression engines 512, 514, and 516, and operate to receive data from source buffer 622, to compress the data in accordance with a particular compression algorithm, and to provide the compressed data to be stored to destination buffer 624. However, here, because each compression engine 612, 614, and 616 do not have their own associated destination buffer within memory storage device 620, each compression buffer stores its compressed data internally to SDXI hardware 610. In a particular case, SDXI hardware 610 includes a memory storage device that includes buffer space to receive compression data from source buffer 622 and to store the compressed data from compression engines 612, 614, and 616 prior to storing the compressed data to destination buffer 624. In another case, each one of compression engines 612, 614, and 616 includes buffer space for retaining the results of the compression operations performed by each compression engine. Here, SDXI hardware 610 receives the source data from source buffer 622 via a single DMA transaction and provides the source data to each of compression engines 612, 614, and 616.

In a particular embodiment, compression engines 612, 614, and 616 are instantiations of different compression algorithms, of different settings for a common compression algorithm, or a combination of different compression algorithms and different settings for common compression algorithms. Here, calling application 632 and SDXI driver 634 operate to set up the compression algorithms for compression engines 612, 614, and 616. For example, where SDXI hardware 610 represents a FPGA type device, the compression algorithms can be programmed into the FPGA device as needed or desired. Further, each compression engine can be programmed with the associated setting, or can receive the associated settings as an input. Here further, calling application 632 and SDXI driver 634 may select a range of settings for each one of compression engines 612, 614, and 616. Then, when a particular set data to be compressed, as directed by calling application 632, SDXI driver 634 directs SDXI hardware 6410 to compress the data with all of compression engines 612, 614, and 616. In response, SDXI hardware 610 operates to retrieve the data from source buffer 622, and to provide the source data to compression engines 612, 614, and 616. Compression engines 612, 614, and 616 then compress the source data and make the compressed data available to SDXI hardware 610, and the SDXI hardware stores the compressed data to destination buffer 624.

After each of compression engines 612, 614, and 616 have compressed the data, SDXI hardware 610 operates to determine a compression ratio achieved by each of the compression engines. In particular, SDXI hardware 610 includes response selector logic 618 that operates to determine a compression ratio achieved by each of the compression engines. Here, if a greater compression ratio is desired, then response selector logic 618 determines the compression ratio for the compressed data from each of compression engines 612, 614, and 616, and selects the data with the highest compression ratio, and SDXI hardware 610 stores the selected compressed data to destination buffer 624, and discards the rest of the compressed data from the non-selected compression engines. For example, if calling application 632 is a storage application, then SDXI driver 634 only sends the most compressed version of the data to the associated storage array. Here further, if a higher speed compression is desired, then response selector logic 618 determines which one of compression engines 612, 614, or 616 finishes the data compression first, and SDXI hardware 610 forwards the selected data to destination buffer 624 and discards the rest of the compressed data from the non-selected compression engines. In yet another embodiment, SDXI hardware 610 operates to implement a selection of a fastest compression engine that yields compressed data with a compression ration greater than a compression ratio threshold. For example, SDXI hardware 610 can select the first compressed data that is compressed at greater than a 50% compression ratio.

In a particular embodiment, each time calling application 632 requests to have data compressed, SDXI driver 634 and SDXI hardware 610 operate to perform the parallel compression as described above. That is, in each instance of data compression, compression engines 612, 614, and 616 operate in parallel, and, in effect, compete against each other to provide the most compressed or fastest compressed data. This embodiment may be particularly advantageous when the type of data to be requested varies from one request to another, such as where calling application 632 represents a program to provide zip files for various types of data. In a particular embodiment, where a specific compression ratio is desired, SDXI hardware 610 operates to implement a compression ratio threshold, wherein, when the compression threshold is achieved by one or more of compression engines 612, 614, and 616, the data is deemed to be compressible, and the best compressed data is selected. On the other hand, where none of compression engines 612, 614, or 616 achieve a compression ratio greater than the compression ratio threshold, SDXI hardware 610 deems the data to be incompressible, and the uncompressible data from source buffer 622 is forwarded to the calling application 632. It will be understood that, when any one of compression engines 612, 614, and 616 compress data based upon different settings, that the compression engines may provide metadata associated with the compressed data that identifies the algorithm utilized in the data compression, so that, when the data is to be decompressed, a decompression engine may implement the same algorithm to uncompress the data, as needed or desired.

Figure 7:
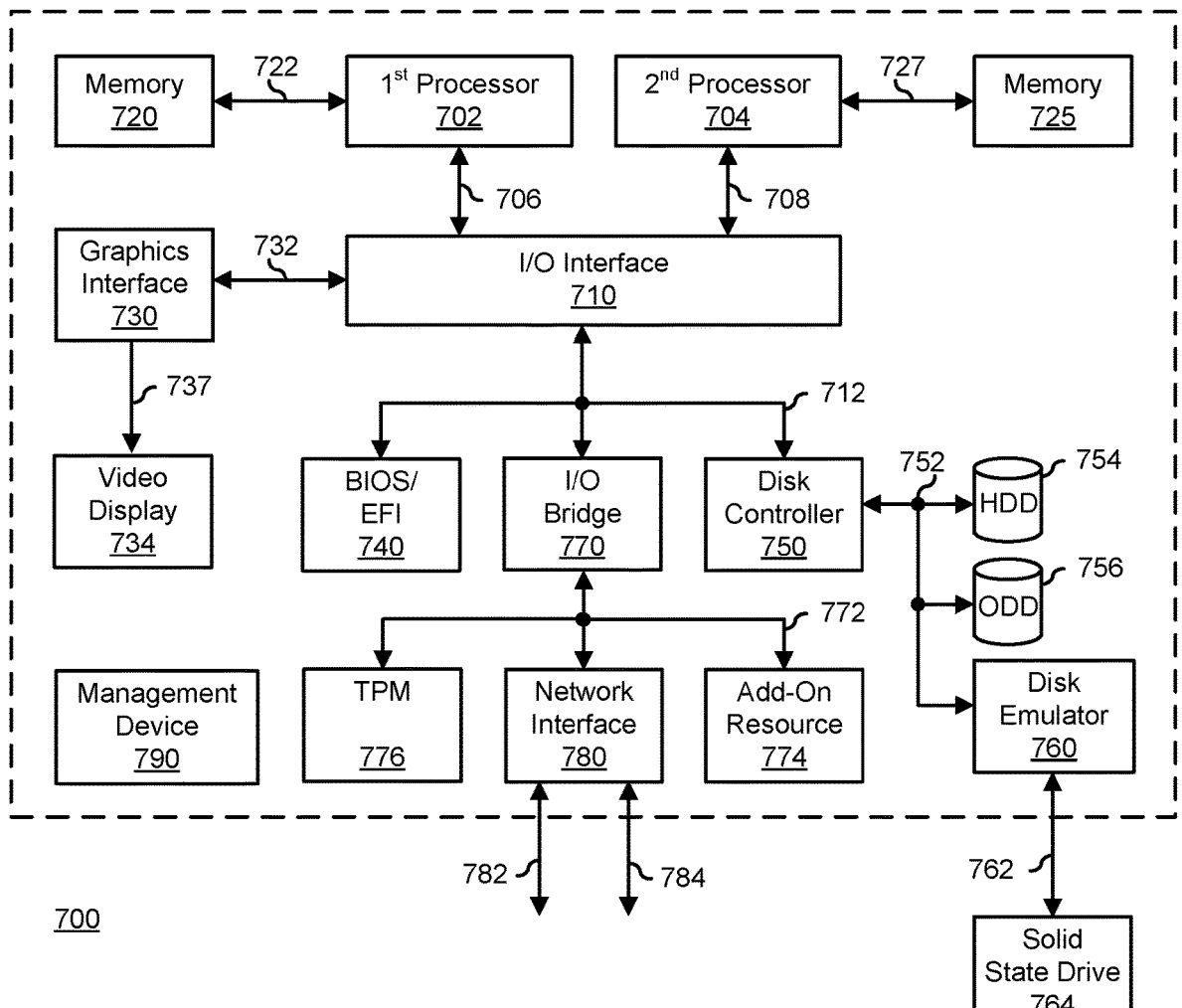
FIG. 7 is a block diagram illustrating a generalized information handling system according to another embodiment of the present disclosure.

FIG. 7 illustrates a generalized embodiment of an information handling system 700. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 700 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 700 can include processing resources for executing machine-executable code, such as a central processing unit (CPU), a programmable logic array (PLA), an embedded device such as a System-on-a-Chip (SoC), or other control logic hardware. Information handling system 700 can also include one or more computer-readable medium for storing machine-executable code, such as software or data. Additional components of information handling system 700 can include one or more storage devices that can store machine-executable code, one or more communications ports for communicating with external devices, and various input and output (I/O) devices, such as a keyboard, a mouse, and a video display. Information handling system 700 can also include one or more buses operable to transmit information between the various hardware components.

Information handling system 700 can include devices or modules that embody one or more of the devices or modules described below, and operates to perform one or more of the methods described below. Information handling system 700 includes a processors 702 and 704, an input/output (I/O) interface 710, memories 720 and 725, a graphics interface 730, a basic input and output system/universal extensible firmware interface (BIOS/UEFI) module 740, a disk controller 750, a hard disk drive (HDD) 754, an optical disk drive (ODD) 756, a disk emulator 760 connected to an external solid state drive (SSD) 762, an I/O bridge 770, one or more add-on resources 774, a trusted platform module (TPM) 776, a network interface 780, a management device 790, and a power supply 795. Processors 702 and 704, I/O interface 710, memory 720, graphics interface 730, BIOS/UEFI module 740, disk controller 750, HDD 754, ODD 756, disk emulator 760, SSD 762, I/O bridge 770, add-on resources 774, TPM 776, and network interface 780 operate together to provide a host environment of information handling system 700 that operates to provide the data processing functionality of the information handling system. The host environment operates to execute machine-executable code, including platform BIOS/UEFI code, device firmware, operating system code, applications, programs, and the like, to perform the data processing tasks associated with information handling system 700.

In the host environment, processor 702 is connected to I/O interface 710 via processor interface 706, and processor 704 is connected to the I/O interface via processor interface 708. Memory 720 is connected to processor 702 via a memory interface 722. Memory 725 is connected to processor 704 via a memory interface 727. Graphics interface 730 is connected to I/O interface 710 via a graphics interface 732, and provides a video display output 736 to a video display 734. In a particular embodiment, information handling system 700 includes separate memories that are dedicated to each of processors 702 and 704 via separate memory interfaces. An example of memories 720 and 730 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 740, disk controller 750, and I/O bridge 770 are connected to I/O interface 710 via an I/O channel 712. An example of I/O channel 712 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 710 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/UEFI module 740 includes BIOS/UEFI code operable to detect resources within information handling system 700, to provide drivers for the resources, initialize the resources, and access the resources. BIOS/UEFI module 740 includes code that operates to detect resources within information handling system 700, to provide drivers for the resources, to initialize the resources, and to access the resources.

Disk controller 750 includes a disk interface 752 that connects the disk controller to HDD 754, to ODD 756, and to disk emulator 760. An example of disk interface 752 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 760 permits SSD 764 to be connected to information handling system 700 via an external interface 762. An example of external interface 762 includes a USB interface, an IEEE 1394 (Firewire) interface, a proprietary interface, or a combination thereof. Alternatively, solid-state drive 764 can be disposed within information handling system 700.

I/O bridge 770 includes a peripheral interface 772 that connects the I/O bridge to add-on resource 774, to TPM 776, and to network interface 780. Peripheral interface 772 can be the same type of interface as I/O channel 712, or can be a different type of interface. As such, I/O bridge 770 extends the capacity of I/O channel 712 when peripheral interface 772 and the I/O channel are of the same type, and the I/O bridge translates information from a format suitable to the I/O channel to a format suitable to the peripheral channel 772 when they are of a different type. Add-on resource 774 can include a data storage system, an additional graphics interface, a network interface card (NIC), a sound/video processing card, another add-on resource, or a combination thereof. Add-on resource 774 can be on a main circuit board, on separate circuit board or add-in card disposed within information handling system 700, a device that is external to the information handling system, or a combination thereof.

Network interface 780 represents a NIC disposed within information handling system 700, on a main circuit board of the information handling system, integrated onto another component such as I/O interface 710, in another suitable location, or a combination thereof. Network interface device 780 includes network channels 782 and 784 that provide interfaces to devices that are external to information handling system 700. In a particular embodiment, network channels 782 and 784 are of a different type than peripheral channel 772 and network interface 780 translates information from a format suitable to the peripheral channel to a format suitable to external devices. An example of network channels 782 and 784 includes InfiniBand channels, Fibre Channel channels, Gigabit Ethernet channels, proprietary channel architectures, or a combination thereof. Network channels 782 and 784 can be connected to external network resources (not illustrated). The network resource can include another information handling system, a data storage system, another network, a grid management system, another suitable resource, or a combination thereof.

Management device 790 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 700. In particular, management device 790 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 700, such as system cooling fans and power supplies. Management device 790 can include a network connection to an external management system, and the management device can communicate with the management system to report status information for information handling system 700, to receive BIOS/UEFI or system firmware updates, or to perform other task for managing and controlling the operation of information handling system 700. Management device 790 can operate off of a separate power plane from the components of the host environment so that the management device receives power to manage information handling system 700 when the information handling system is otherwise shut down. An example of management device 790 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 790 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system for compressing data, the information handling system comprising:
   a processor;
   a memory device including a source data buffer and at least one destination data buffer; and
   a smart data accelerator interface (SDXI) hardware accelerator including a plurality of compression engines, each compression engine configured to provide a different compression function;
   wherein:
      the source data buffer provides compression data to the compression engines;
      the at least one destination data buffer receives compressed data from the compression engines; and
      the processor instantiates a compression engine driver configured to instruct the SDXI hardware accelerator 1) to process a first command to determine that first data from the source data buffer is a first type of data, to direct each compression engine to compress the first data, and to retrieve select first compressed data from a first one of the compression engines from the at least one destination data buffer, the selection being based upon a first selection criterion, and 2) to process a second command to determine that second data from the source data buffer is the first type of data, to direct the first compression engine to compress the second data, and to retrieve second compressed data from the first compression engine;
   wherein, the compression engine driver is further configured to process a third command to determine that third data from the source data buffer is a second type of data, to direct each compression engine to compress the third data, and to retrieve select third compressed data from a second one of the compression engines from the at least one destination data buffer, the selection being based upon a second selection criterion.

2. The information handling system of claim 1, wherein the different compression functions include different compression algorithms.

3. The information handling system of claim 1, wherein the different compression functions include a common compression algorithm, and further include different algorithmic settings.

4. The information handling system of claim 3, wherein the different algorithmic settings include at least one of a different compression level, a different minimum match length, a different maximum match length, a different hash depth, a different match level, and a different static library.

5. The information handling system of claim 1, wherein the first selection criterion includes selecting the selected compression engine because the compressed data from the selected compression engine has a highest compression ratio.

6. The information handling system of claim 1, wherein the selection first criterion includes selecting the selected compression engine because the compression of the data from the selected compression engine has a compression ratio that is greater than a compression ratio threshold.

7. The information handling system of claim 6, wherein the selection first criterion further includes selecting the selected compression engine because the data from the selected compression engine was a first compressed data with the compression ratio that is greater than the compression ratio threshold.

8. The information handling system of claim 1 wherein the selection first criterion includes selecting the selected compression engine because the compression of the data from the selected compression engine has a fastest compression speed.

9. The information handling system of claim 1, wherein the at least one destination buffer includes a plurality of destination buffers, each destination buffer to receive compressed data from an associated one of the compression engines, and wherein the compression engine driver is further configured to select the first compression engine.

10. A method for compressing data, the method comprising:
   providing, on an information handling system, a memory including a source data buffer and at least one destination data buffer;
   providing, on the information handling system, a smart data accelerator interface (SDXI) hardware accelerator including a plurality of compression engines, each compression engine configured to provide a different compression function;
   instantiating, on a processor of the information handling system, a compression engine driver;
   instructing, by the compression engine driver, the SDXI hardware accelerator to process a first command;
   processing, by the SDXI hardware accelerator, the first command, wherein in processing the first command, the method further comprises:
      determining that first data from a source data buffer of the information handling system is a first type of data;
      directing each compression engine to compress the first data; and
      retrieving, by the compression engine driver, select compressed data from a first one of the compression engines stored in a destination data buffer of the information handling system, the selection being based upon a first selection criterion; and
   processing, by the SDXI hardware accelerator, the second command, wherein in processing the second command, the method further comprises:
      determining that second data from the source data buffer is the first type of data;
      directing the first compression engine to compress the first data; and
      retrieving, by the compression engine driver, select compressed data from the first compression engines stored in the destination data buffer; and processing, by the SDXI hardware accelerator, a third command, wherein in processing the third command, the method further comprises:
- determining that third data from the source data buffer is a second type of data;
- directing each compression engine to compress the third data; and
- retrieving, by the compression engine driver, select third compressed data from a second one of the compression engines from the at least one destination data buffer, the selection being based upon a second selection criterion.

11. The method of claim 10, wherein the different compression functions include different compression algorithms.

12. The method of claim 10, wherein the different compression functions include a common compression algorithm, and further include different algorithmic settings.

13. The method of claim 12, wherein the different algorithmic settings include at least one of a different compression level, a different minimum match length, a different maximum match length, a different hash depth, a different match level, and a different static library.

14. The method of claim 10, wherein the different algorithmic settings include at least one of a different compression level, a different minimum match length, a different maximum match length, a different hash depth, a different match level, and a different static library.

15. The method of claim 10, wherein the first selection criterion includes selecting the selected compression engine because the compression of the data from the selected compression engine has a compression ratio that is greater than a compression ratio threshold.

16. The method of claim 15, wherein the first selection criterion further includes selecting the selected compression engine because the data from the selected compression engine was a first compressed data with the compression ratio that is greater than the compression ratio threshold.

17. The method of claim 10 wherein the first selection criterion includes selecting the selected compression engine because the compression of the data from the selected compression engine has a fastest compression speed.

18. The method of claim 10, wherein the at least one destination buffer includes a plurality of destination buffers, each destination buffer to receive compressed data from an associated one of the compression engines, and wherein the compression engine driver is further configured to select the first compression engine.

19. A smart data accelerator interface hardware device for compressing data, the hardware device comprising:
- a plurality of compression engines each configured to provide a different compression function;
- a source data buffer to provide compression data to the compression engines; and
- at least one destination data buffer to receive compressed data from the compression engines;
- wherein the hardware device executes code to direct each compression engine 1) to process a first command to determine that first compression data is a first type of data, to compress the first compression data, and to store select first compressed data from a first one of the compression engines to the one destination data buffer, the selection being based upon a first selection criterion, 2) To process a second command to determine that second compression data is the first type of data, to compress the second compression data, and to store compressed data from the first compression engine to the destination data buffer, and 3) to process a third command to determine that third compression data is a second type of data, to compress the second compression data, and to store select second compressed data from a second one of the compression engines to destination data buffer, the selection being based upon a second selection criterion.

* * * * *